(12) United States Patent
Koike et al.

(10) Patent No.: US 6,979,584 B2
(45) Date of Patent: Dec. 27, 2005

(54) METHOD FOR PRODUCING GROUP III NITRIDE COMPOUND SEMICONDUCTOR AND GROUP III NITRIDE COMPOUND SEMICONDUCTOR DEVICE

(75) Inventors: Masayoshi Koike, Aichi (JP); Yuta Tezen, Aichi (JP); Toshio Hiramatsu, Aichi (JP)

(73) Assignee: Toyoda Gosei Co, Ltd., Aichi-ken (JP)

( * ) Notice: Subject to any disclaimer, the term of this patent is extended or adjusted under 35 U.S.C. 154(b) by 201 days.

(21) Appl. No.: 10/168,617

(22) PCT Filed: Dec. 21, 2000

(86) PCT No.: PCT/JP00/09120

§ 371 (c)(1),
(2), (4) Date: Sep. 12, 2002

(87) PCT Pub. No.: WO01/48798

PCT Pub. Date: Jul. 5, 2001

(65) Prior Publication Data

US 2003/0092263 A1  May 15, 2003

(30) Foreign Application Priority Data

Dec. 24, 1999  (JP)  ................................. 11-367614

(51) Int. Cl.[7] ............................................. H01L 21/20
(52) U.S. Cl. ..................... 438/44; 438/483; 438/718
(58) Field of Search .................... 438/22–47, 479–509, 438/689–744; 117/95

(56) References Cited

U.S. PATENT DOCUMENTS 5,185,290 A  2/1993 Aoyagi et al.
5,798,536 A  8/1998 Tsutsui
6,051,849 A  4/2000 Davis et al.
6,110,277 A  8/2000 Braun
6,121,121 A  9/2000 Koide
6,146,457 A  11/2000 Solomon
6,153,010 A  11/2000 Kiyoku et al.

(Continued)

FOREIGN PATENT DOCUMENTS

EP  0 551 721 A2  7/1993

(Continued)

OTHER PUBLICATIONS

D. Kapolnek et al., "Anisotropic epitaxial lateral growth in GaN selective area epitaxy", Appl. Phys. Lett. 71(9), Sep. 1, 1997, pp. 1204-1206.

(Continued)

*Primary Examiner*—Savitri Mulpuri
(74) *Attorney, Agent, or Firm*—McGinn IP Law Group, PLLC

(57) ABSTRACT

A first Group III nitride compound semiconductor layer 31 is etched, to thereby form an island-like structure such as a dot-like, stripe-shaped, or grid-like structure, so as to provide a trench/post. Thus, a second Group III nitride compound layer 32 can be epitaxially grown, vertically and laterally, from a top surface of the post and a sidewall/sidewalls of the trench serving as a nucleus for epitaxial growth, to thereby bury the trench and also grow the layer in the vertical direction. In this case, propagation of threading dislocations contained in the first Group III nitride compound semiconductor layer 31 can be prevented in the upper portion of the second Group III nitride compound semiconductor 32 that is formed through lateral epitaxial growth. As a result, a region having less threading dislocations is formed at the buried trench.

18 Claims, 11 Drawing Sheets

U.S. PATENT DOCUMENTS

| | | | |
|---|---|---|---|
| 6,177,359 B1 * | 1/2001 | Chen et al. | 438/751 |
| 6,274,518 B1 | 8/2001 | Yuri et al. | |
| 6,316,785 B1 | 11/2001 | Nunoue et al. | |
| 6,319,742 B1 | 11/2001 | Hayashi et al. | |
| 6,329,667 B1 | 12/2001 | Ota et al. | |
| 6,355,497 B1 | 3/2002 | Romano et al. | |
| 6,365,921 B1 | 4/2002 | Watanabe et al. | |
| 6,403,451 B1 * | 6/2002 | Linthicum et al. | 438/479 |
| 6,500,257 B1 * | 12/2002 | Wang et al. | 117/95 |
| 6,582,986 B2 * | 6/2003 | Kong et al. | 438/48 |

FOREIGN PATENT DOCUMENTS

| | | |
|---|---|---|
| EP | 0 779 666 A3 | 6/1997 |
| EP | 0 951 055 A2 | 10/1999 |
| EP | 0 993 048 A2 | 4/2000 |
| EP | 1 045 431 A1 | 10/2000 |
| EP | 1 059 661 A2 | 12/2000 |
| EP | 1 059 677 A2 | 12/2000 |
| JP | 49-149679 | 4/1973 |
| JP | 48-95181 | 12/1973 |
| JP | 51-137393 | 11/1976 |
| JP | 55-34646 | 8/1978 |
| JP | 57-115849 | 7/1982 |
| JP | 58-33882 | 2/1983 |
| JP | 1-316459 | 12/1989 |
| JP | 3-113182 | 6/1991 |
| JP | 4-10665 | 1/1992 |
| JP | 4-84418 | 3/1992 |
| JP | 4-303920 | 10/1992 |
| JP | 5-41536 | 2/1993 |
| JP | 5-110206 | 4/1993 |
| JP | 5-283744 | 10/1993 |
| JP | 5-343741 | 12/1993 |
| JP | 6-196757 | 7/1994 |
| JP | 07-249830 | 9/1995 |
| JP | 7-273367 | 10/1995 |
| JP | 8-64791 | 3/1996 |
| JP | 8-102549 | 4/1996 |
| JP | 8-116090 | 5/1996 |
| JP | 8-222812 | 8/1996 |
| JP | 8-274411 | 10/1996 |
| JP | 9-162125 | 6/1997 |
| JP | 10-312971 | 11/1998 |
| JP | 10-321954 | 12/1998 |
| JP | 11-031864 | 2/1999 |
| JP | 11-043398 | 2/1999 |
| JP | 11-135770 | 5/1999 |
| JP | 11-135832 | 5/1999 |
| JP | 11-145516 | 5/1999 |
| JP | 11-145519 | 5/1999 |
| JP | 11-191533 | 7/1999 |
| JP | 11-191657 | 7/1999 |
| JP | 11-191659 | 7/1999 |
| JP | 11-219910 | 8/1999 |
| JP | 11-251632 | 9/1999 |
| JP | 11-260737 | 9/1999 |
| JP | 11-274082 | 10/1999 |
| JP | 11-312825 | 11/1999 |
| JP | 11-329971 | 11/1999 |
| JP | 11-330546 | 11/1999 |
| JP | 11-340508 | 12/1999 |
| JP | 2000-021789 | 1/2000 |
| JP | 2000-44121 | 2/2000 |
| JP | 2000-91253 | 3/2000 |
| JP | 2000-106455 | 4/2000 |
| JP | 2000-106473 | 4/2000 |
| JP | 2000-124500 | 4/2000 |
| JP | 2000-150959 | 5/2000 |
| JP | 2000-174393 | 6/2000 |
| JP | 2000-232239 | 8/2000 |
| JP | 2000-244061 | 9/2000 |
| JP | 2000-261106 | 9/2000 |
| JP | 2000-277437 | 10/2000 |
| JP | 2000-299497 | 10/2000 |
| JP | 2000-357663 | 12/2000 |
| JP | 2000-357843 | 12/2000 |
| JP | 2001-60719 | 3/2001 |
| JP | 2001-93837 | 4/2001 |
| JP | 2001-111174 | 4/2001 |
| JP | 2001-122693 | 5/2001 |
| JP | 2001-176813 | 6/2001 |
| JP | 2001-257193 | 9/2001 |
| WO | WO 97/11518 | 3/1997 |
| WO | WO 98/47170 | 10/1998 |
| WO | WO 99/01594 | 1/1999 |
| WO | WO 00/04615 | 1/2000 |
| WO | WO 00/55893 | 9/2000 |
| WO | WO 02/058120 A1 | 7/2002 |

OTHER PUBLICATIONS

Matsushima et al., "Selective growth of GaN on sub-micron pattern by MOVPE", Technical Report of IEICE, ED97-32, CPM97-20 (May 1997) pp. 41-46.

Ujiie et al., "Epitaxial Lateral Overgrowth of GaAs on a Si Substrate", Japanese Journal of Applied Physics vol. 28, No. 3, Mar., 1989, pp. L337-L339.

Partial Translation of the Office Action for Japanese Patent Application No. 9-311518 dated Jun. 10, 2003.

PCT Forms 338 and 409 (IPER) (PCT/JP02/05446) and translation thereof.

PCT Forms 338 and 409 (IPER) (PCT/JP02/02628) and translations thereof.

PCT Forms 338 and 409 (IPER) (PCT/JP02/01159) and translations thereof.

Nam et al., "Lateral epitaxy of low defect density GaN layers via organometallic vapor phase epitaxy", pp. 2638-2640, Appl. Phys. Lett. 71 (18), Nov. 3, 1997.

Hiramatsu et al., "Selective area growth and epitaxial lateral overgrowth of GaN by metalorganic vapor phase epitaxy and hydride vapor phase epitaxy", pp. 104-111, Materials Science and Engineering B59 (1999).

Akasaki et al., "Effects of AIN Buffer Layer on Crystallographic Structure and on Electrical and Optical Properties of GaN and Ga1-xAlxN . . . Movpe" pp. 209-219, Journal of Crystal Growth 98 (1989) North-Holland, Amsterdam.

Yang et al., High quality GaN-InGaN heterostructures grown on (111) silicon substrates, pp. 3566-3568 , Appl. Phys. Lett. 69 (23), Dec. 2, 1996.

Wolf et al., for the VLSI Era, vol. 1—Process Technology, p. 5, "Silicon: Single Crystal Growth and Wafer Preparation.".

Luther et al., "Titanium and titanium nitride contacts to n-type gallium nitride", Semicond. Sci. Technol. 13 (1998) pp. 1322-1327.

Dimitriadis et al., "Contacts of titanium nitride to—and p-type gallium nitride films", Solid-State Electronics 43 (1999), pp. 1969-1972.

Zheleva et al., "Pendeo-Epitaxy-A New Approach for Lateral Growth of Galium Nitride Structures", MRS Internet J. Nitride Semicond. Res. 4SI, G3.38 (1999), 6 pages total.

Uchida et al., "AlGaInN based Laser Diodes", In-Plans Semiconductor Lasers IV, III-Vs Review vol. 13, No. 3, May/Jun. 2000, pp. 156-164.

Zhelevs et al., Pendeo-Epitaxy versus Lateral Epitaxial Overgrowth of GaN: A Comparative Study via Finite element Analysis, Journal of electronic Materials, vol. 28, No. 4, Apr. 1999, pp. 545-551.

Zheleva et al., "Pendeo-Epitaxy: A New Approach for Lateral Growth of Gallium Nitride Films", Journal of Electronic Materials, vol. 28, No. 4, 1999, pp. L5-L8.
PCT Form 210 (PCT/JP02/05446).
PCT Form 210 (PCT/JP02/02628).
PCT Form 210 (PCT/JP02/01159).
PCT Form 210 (PCT/JP01/01928).
PCT Form 210 (PCT/JP01/02695).
PCT Form 210 (PCT/JP00/09120).
PCT Form 210 (PCT/JP01/01396).
PCT Form 210 (PCT/JP01/01178).
PCT Form 210 (PCT/JP01/01663).
PCT Form 210 (PCT/JP00/09121).
PCT Form 210 (PCT/JP00/09220).
PCT Forms 338 and 409 (IPER) (PCT/JP01/02695) and translations.
PCT Forms 338 and 409 (IPER) (PCT/JP01/01663) and translations.
PCT Forms 338 and 409 (PCT/JP01/01928) and translations thereof.
PCT Forms 338 and 409 (PCT/JP01/01396) and translations thereof.
European Search Report (EP 27057) Jul. 18, 2000.
European Search Report (EP 27279) Feb. 15, 2002.
PCT Forms 338 and 409 (IPER) (PCT/JP00/09121) and translations.
Wolf et al., "Silicon Processing for the VLSI Era," vol. 1, p. 5, Lattice Press, 1986.

* cited by examiner

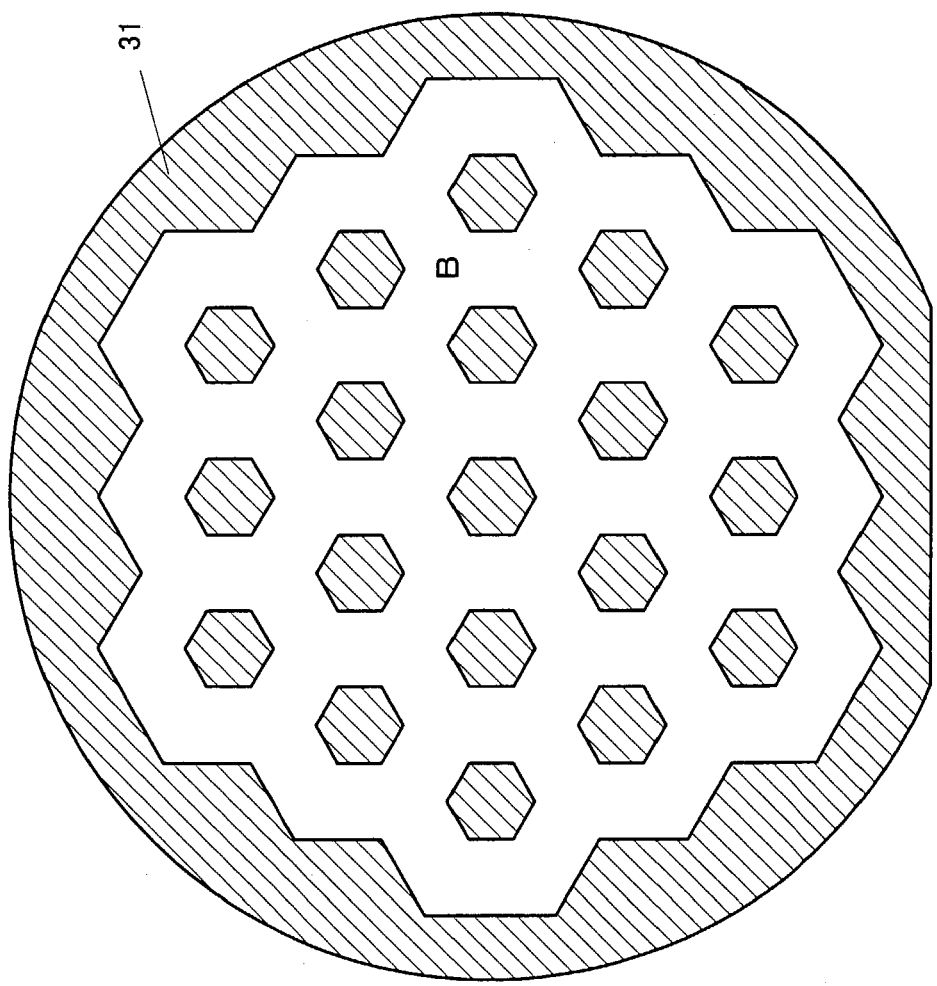
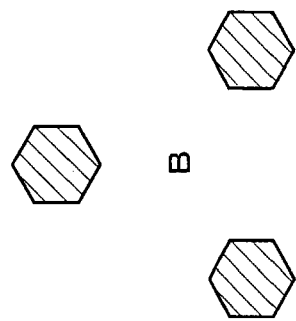
FIG. 10A
FIG. 10B

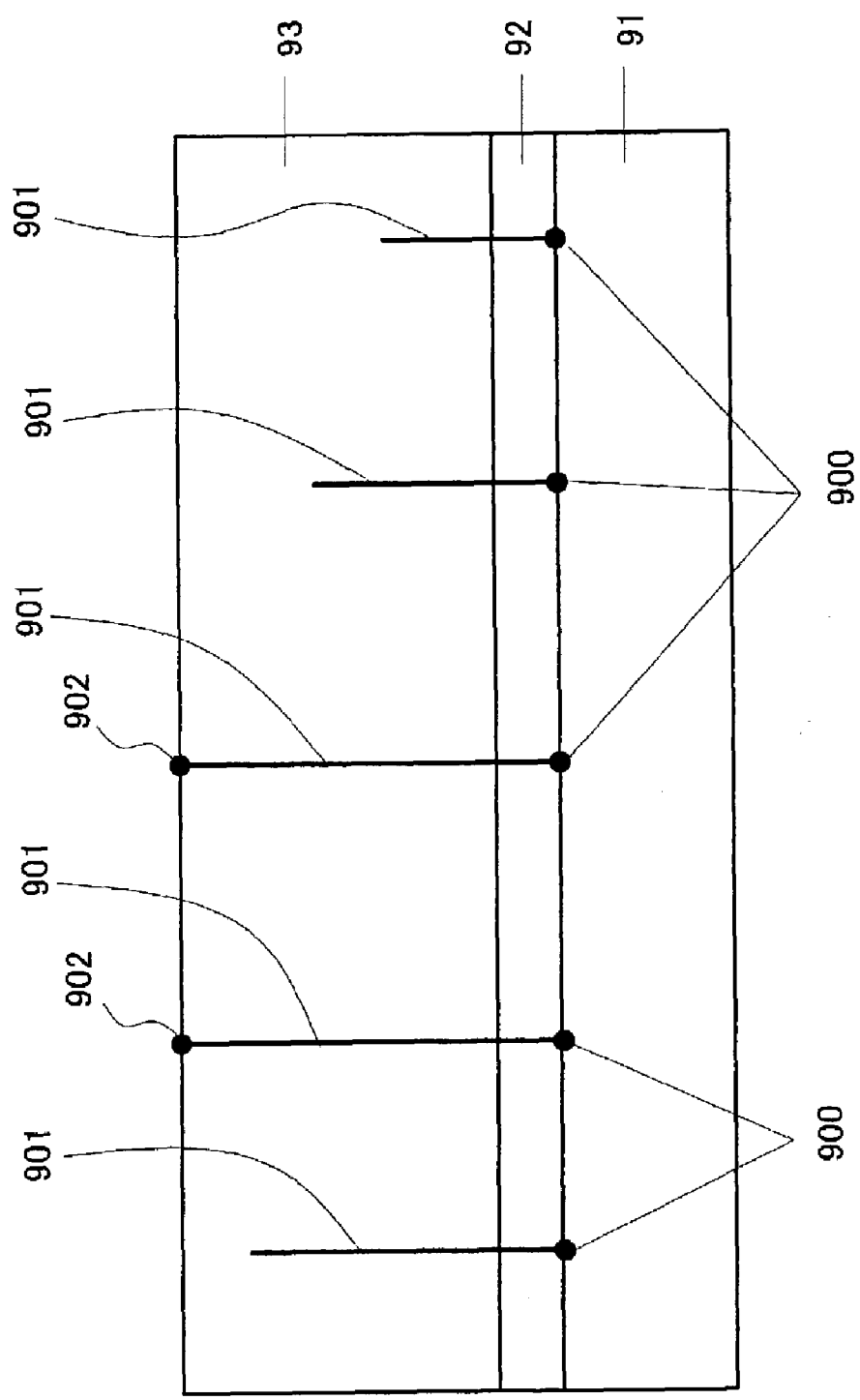

METHOD FOR PRODUCING GROUP III NITRIDE COMPOUND SEMICONDUCTOR AND GROUP III NITRIDE COMPOUND SEMICONDUCTOR DEVICE

This is a patent application based on a PCT application No. PCT/JP00/09120 filed on Dec. 21, 2000, which is based on a Japanese patent application No. H11-367614 filed on Dec. 24, 1999, and is incorporated herein by reference.

TECHNICAL FIELD

The present invention relates to a method for fabricating Group III nitride compound semiconductors. More particularly, the present invention relates to a method for fabricating Group III nitride compound semiconductors employing epitaxial lateral overgrowth (ELO). The Group III nitride compound semiconductors are generally represented by $Al_xGa_yIn_{1-x-y}N$ (wherein $0 \leq x \leq 1$, $0 \leq y \leq 1$, and $0 \leq x+y \leq 1$), and examples thereof include binary semiconductors such as AlN, GaN, and InN; ternary semiconductors such as $Al_xGa_{1-x}N$, $Al_xIn_{1-x}N$, and $Ga_xIn_{1-x}N$ (wherein $0<x<1$); and quaternary semiconductors such as $Al_xGa_yIn_{1-x-y}N$ (wherein $0<x<1$, $0<y<1$, and $0<x+y<1$). In the present specification, unless otherwise specified, "Group III nitride compound semiconductors" encompass Group III nitride compound semiconductors which are doped with an impurity so as to assume p-type or n-type conductivity.

BACKGROUND ART

Group III nitride compound semiconductor are direct-transition semiconductors exhibiting a wide range of emission spectra from UV to red light when used in a device such as a light-emitting device, and have been used in light-emitting devices such as light-emitting diodes (LEDs) and laser diodes (LDs). In addition, due to their broad band gaps, devices employing the aforementioned semiconductors are expected to exhibit reliable operational characteristics at high temperature as compared with those employing semiconductors of other types, and thus application thereof to transistors such as FETs has been energetically studied. Moreover, since Group III nitride compound semiconductors contain no arsenic (As) as a predominant element, application of Group III nitride compound semiconductors to various semiconducting devices has been longed for from the environmental aspect. Generally, these Group III nitride compound semiconductors are formed on a sapphire substrate.

DISCLOSURE OF THE INVENTION

However, when a Group III nitride compound semiconductor is formed on a sapphire substrate, misfit-induced dislocations occur due to difference between the lattice constant of sapphire and that of the semiconductor, resulting in poor device characteristics. Misfit-induced dislocations are threading dislocations which penetrate semiconductor layers in a longitudinal direction (i.e., in a direction vertical to the surface of the substrate), and Group III nitride compound semiconductors are accompanied by the problem that dislocations in amounts of approximately $10^9$ cm$^{-2}$ propagate therethrough. The aforementioned dislocations propagate through layers formed from Group III nitride compound semiconductors of different compositions, until they reach the uppermost layer. When such a semiconductor is incorporated in, for example, a light-emitting device, the device poses problems of unsatisfactory device characteristics in terms of threshold current of an LD, service life of an LED or LD, etc. On the other hand, when a Group III nitride compound semiconductor is incorporated in any of other types of semiconductor devices, because electrons are scattered due to defects in the Group III nitride compound semiconductor, the semiconductor device comes to have low mobility. These problems are not solved even when another type of substrate is employed.

The aforementioned dislocations will next be described with reference to a sketch of FIG. 11. FIG. 11 shows a substrate 91, a buffer layer 92 formed thereon, and a Group III nitride compound semiconductor layer 93 further formed thereon. Conventionally, the substrate 91 is formed of sapphire or a similar substance and the buffer layer 92 is formed of aluminum nitride (AlN) or a similar substance. The buffer layer 92 formed of aluminum nitride (AlN) is provided so as to relax misfit between the sapphire substrate 91 and the Group III nitride compound semiconductor layer 93. However, generation of dislocations is not reduced to zero. Threading dislocations 901 propagate upward (in a vertical direction with respect to the substrate surface) from dislocation initiating points 900, penetrating the buffer layer 92 and the Group III nitride compound semiconductor layer 93. When a semiconductor device is fabricated by stacking various types of Group III nitride compound semiconductors of interest on the Group III nitride compound semiconductor layer 93, threading dislocations further propagate upward, through the semiconductor device, from dislocation arrival points 902 on the surface of the Group III nitride compound semiconductor layer 93. Thus, according to conventional techniques, problematic propagation of dislocations cannot be prevented during formation of Group III nitride compound semiconductor layers.

The present invention has been accomplished in an attempt to solve the aforementioned problems, and an object of the present invention is to fabricate a Group III nitride compound semiconductor with suppressed generation of threading dislocations.

In order to attain the aforementioned object, the invention drawn to a first feature provides a method for fabricating a Group III nitride compound semiconductor through epitaxial growth thereof, comprising the steps of etching an underlying layer which comprises at least one layer of a Group III nitride compound semiconductor and a first Group III nitride compound semiconductor as an uppermost layer, to thereby form an island-like structure such as a dot-like, stripe-shaped, or grid-like structure, and epitaxially growing, vertically and laterally, a second Group III nitride compound semiconductor, with a top surface of the post and a sidewall of the trench serving as a nucleus for epitaxial growth, the post and the trench being formed by etching the first Group III nitride compound semiconductor so as to form an island-like structure such as a dot-like, stripe-shaped, or grid-like structure. In the present specification, the term "underlying layer" is used so as to collectively encompass a Group III nitride compound semiconductor single layer and a multi-component layer containing at least one Group III nitride compound semiconductor layer. The expression "island-like structure" conceptually refers to the pattern of the upper portions of the posts formed through etching, and does not necessarily refer to regions separated from one another. Thus, upper portions of the posts may be continuously connected together over a considerably wide area, and such a structure may be obtained by forming the entirety of a wafer into a stripe-shaped or grid-like structure. The sidewall/sidewalls of the trench refers not only to a plane vertical to the substrate plane and the surface of a Group III nitride compound semiconductor, but also to an oblique plane. The trench may have a V-shaped cross-section with no flat surface on the bottom of the trench. Unless otherwise specified, these definitions are equally applied to the below-appended claims.

The invention drawn to a second feature provides a method for fabricating a Group III nitride compound semiconductor as recited in connection with the first feature, wherein the depth and the width of the trench are determined such that lateral growth from the sidewall/sidewalls for covering the trench proceeds faster than vertical growth from the bottom portion of the trench for burying. As used herein, in the trench having a V-shaped cross-section with no flat surface on the bottom of the trench, the bottom portion of the trench means the bottom portion formed through epitaxial growth.

The invention drawn to a third feature provides a method for fabricating a Group III nitride compound semiconductor, wherein substantially all the sidewalls of the trench are a {11-20} plane.

The invention drawn to a fourth feature provides a method for fabricating a Group III nitride compound semiconductor, wherein the first Group III nitride compound semiconductor and the second Group III nitride compound semiconductor have the same composition. As used herein, the term "same composition" does not exclude differences on a doping level (differences by less than 1 mol %) from its meaning.

The invention drawn to fifth to ninth features provide methods each of which carries out a series of processes described in the first to fourth features, respectively, twice. The invention drawn to a fifth feature corresponds to the first feature explained above. That is, the fifth feature provides a method for fabricating a Group III nitride compound semiconductor through epitaxial growth comprising the steps of etching an underlying layer which comprises at least one layer of a Group III nitride compound semiconductor and a first Group III nitride compound semiconductor as uppermost layer to thereby form an island-like structure such as a dot-like, stripe-shaped, or grid-like structure, so as to provide a first trench/post, epitaxially growing, vertically and laterally, a second Group III nitride compound semiconductor, with a top surface of the post and a sidewall of the first trench serving as a nucleus for epitaxial growth, etching at least a portion of the second Group III nitride compound semiconductor corresponding to the upper region of the uppermost layer of the first trench/post, so as to provide a second trench/post, the second Group III nitride compound semiconductor being grown from the top surface and a sidewall of the first post of the first Group III nitride compound semiconductor served as a nucleus, and epitaxially growing, vertically and laterally, a third Group III nitride compound semiconductor, with a top surface of the post and a sidewall of the second trench as a nucleus for epitaxial growth. Here carrying out a series of processes described in the first to fourth features twice is not limited to carrying out substantially the same series of processes two times. All shape, sidewall, and bottom surface of each trench/post should not be the same. That can be applied to below-appended features.

The invention drawn to a sixth feature corresponds to the second feature. That is, the depth and the width of the bottom portion of the first and second trenches are determined such that lateral growth from the sidewall/sidewalls for covering the trench proceeds faster than vertical growth from the bottom portion of the first and second trenches for burying.

The invention drawn to a seventh feature corresponds to the third feature. That is, substantially all the sidewalls of the first and the second trenches are a {11-20} plane.

The invention drawn to an eighth feature is to apply the fourth feature to the first layer grown by lateral epitaxial growth. That is, the eighth feature provides that the first Group III nitride compound semiconductor and the second Group III nitride compound semiconductor have the same composition.

The invention drawn to a ninth feature is to apply the fourth feature to the second layer grown by lateral epitaxial growth. That is, the ninth feature provides that the second Group III nitride compound semiconductor and the third Group III nitride compound semiconductor have the same composition.

The invention drawn to tenth and eleventh features provide a Group III nitride compound semiconductor device which is formed on an upper layer of a lateral-epitaxially grown portion of a Group III nitride compound semiconductor layer produced through a method for fabricating a Group III nitride compound semiconductor as recited in connection with any one of the first to fourth features and any one of fifth to ninth features, respectively. The invention drawn to twelfth and thirteenth features provide a Group III nitride compound semiconductor light-emitting device which is produced by stacking a different Group III nitride compound semiconductor layer on an upper layer of a lateral-epitaxially grown portion of a Group III nitride compound semiconductor layer produced through a method for fabricating a Group III nitride compound semiconductor as recited in connection with any one of the first to fourth features and any one of the fifth to ninth features, respectively.

The invention drawn to fourteenth and fifteenth features provide a method for fabricating a Group III nitride compound semiconductor as recited in connection with any one of the first to fourth features and any one of the fifth to ninth features, respectively, further comprising removing substantially entire portions except for an upper layer formed on a portion provided through lateral epitaxial growth, to thereby obtain a Group III nitride compound semiconductor substrate.

The outline of an example of the method for fabricating a Group III nitride compound semiconductor of the present invention will next be described with reference to FIGS. 1–4. Although FIGS. 1–4 illustrate layers accompanied by a substrate 1 and a buffer layer 2 so as to facilitate description and understanding of relevant dependent claims, the substrate 1 and the buffer layer 2 are not essential elements of the present invention, as the present invention is to produce a Group III nitride compound semiconductor layer including a region in which threading dislocations in the vertical direction are reduced from a Group III nitride compound semiconductor having threading dislocations in the vertical direction. The gist of the operation and effects of the present invention will next be described with reference to an embodiment in which a first Group III nitride compound semiconductor layer 31 having threading dislocations in the vertical direction (direction vertical to the substrate surface) is provided on the substrate 1 via the buffer layer 2.

As shown in FIG. 1A, the first Group III nitride compound semiconductor layer 31 is formed on the buffer layer 2 and etched to thereby form an island-like structure such as a dot-like, stripe-shaped, or grid-like structure, so as to provide a trench/post. Thus, a second Group III nitride compound layer 32 can be epitaxially grown, vertically and laterally, with a top surface of the post and a sidewall/ sidewalls of the trench serving as a nucleus for epitaxial growth, to thereby bury the trench and also grow the layer upward. In this case, propagation of threading dislocations contained in the Group III nitride compound semiconductor layer 31 can be prevented in the upper portion of the second Group III nitride compound semiconductor 32 that is formed through lateral epitaxial growth, and a region in which treading dislocations are reduced is provided in the thus-buried trench (first feature). When the second Group III nitride compound semiconductor 32 is epitaxially grown vertically and laterally, as shown in FIG. 1B, there exist a portion which grows from a top surface of the post serving as a nucleus for epitaxial growth, a portion which grows from a sidewall/sidewalls of the trench serving as a nucleus for epitaxial growth, and a portion which grows from a bottom surface of the post serving as a nucleus for epitaxial growth. In the present invention, epitaxial growth is carried out so that existence of the portion which grows from a sidewall/sidewalls of the trench serving as a nucleus for epitaxial growth becomes clear. Thus, threading dislocations are not propagated in the vertical direction in the portion formed through lateral growth from a sidewall of the trench serving as a nucleus for epitaxial growth. Because epitaxial growth yields no substantial discontinuity in the interface between the Group III nitride compound semiconductor layer 31 and the second Group III nitride compound semiconductor 32, no electrical resistance attributed to a discontinuous portion is generated with respect to current flow in the vertical direction (direction normal to the surface of the substrate 1), as compared with a similar structure having a mask made of an insulator or the like. Furthermore, a stable structure can be fabricated.

When the coalescence of lateral epitaxial growth fronts starting from the sidewalls of the trench facing to each other is faster than the rate that the second Group III nitride group compound semiconductor 32 epitaxially grows in the vertical direction for burying the trench, in the upper portion of the thus-buried Group III nitride compound semiconductor 32, the propagation is remarkably suppressed from the Group III nitride compound semiconductor 31, to thereby provide a crystal region of remarkably high quality (second feature). In this case, as shown in FIG. 1C, the portion which grows from a bottom surface of the post serving as a nucleus for epitaxial growth does not come out of the surface, and cavities remain in the trench. Over the cavities, growth fronts of the Group III nitride compound semiconductor 32 grown from the two sidewalls of the trench, serving as nuclei for epitaxial growth, coalesce. Then threading dislocations propagated from the Group III nitride compound semiconductor layer 31 are prevented from being propagated by these cavities. As a result, no electrical resistance attributed to a discontinuous portion is generated with respect to current flow in the vertical direction (direction normal to the surface of the substrate 1). Furthermore, a stable structure can be fabricated.

The aforementioned lateral epitaxial growth can be readily attained when the sidewall formed of the Group III nitride compound semiconductor layer 31 is a {11-20} plane (third feature). During lateral epitaxial growth, at least a top of the growth front may remain a {11-20} plane. When the first Group III nitride compound semiconductor and the second Group III nitride compound semiconductor have the same composition, lateral epitaxial growth can be readily attained (fourth feature).

Through the procedure as described above, threading dislocations propagated from the Group III nitride compound semiconductor layer 31 are prevented, to thereby provide a stable structure, and the Group III nitride compound semiconductor 32 can be formed without increasing electrical resistance attributed to a discontinuous interface. Although FIG. 1 illustrates a sidewall of the trench vertical to the substrate plane, the present invention is not limited thereto, and the sidewall may be an oblique plane. The trench may have a V-shaped cross-section with no flat surface on the bottom of the trench. These features are equally applied to the descriptions below.

In FIG. 1, the buffer layer 2 and the Group III nitride compound semiconductor layer 31 are formed on the substrate 1 in sequence and an etching which is shallower than a thickness of the Group III nitride compound semiconductor is carried out. Alternatively, as shown in FIG. 2, a degree of the etching depth may be as thick as the thickness of the Group III nitride compound semiconductor layer 31 so that the buffer layer 2 may be exposed as a bottom portion of the trench. In this case, the present invention may be carried out by adjusting epitaxial condition and width and depth of the trench such that lateral growth from the sidewall/sidewalls and the upper surface of the Group III nitride compound semiconductor layer 31 for covering the trench proceeds faster than vertical growth of the Group III nitride compound semiconductor layer 32 from the buffer layer 2 for burying the trench. That shows the similar effect as described in FIG. 1.

Alternatively, as shown in FIG. 3, the buffer layer formed on the substrate as the underlying layer and the Group III nitride compound layer grown on the buffer layer may be regarded as one period, and a layer comprising plural periods of these layers may be used. In FIG. 3, the buffer layer 21, the Group III nitride compound semiconductor layer 22, the buffer layer 23, and the Group III nitride compound semiconductor layer 31 are formed in sequence, and the Group III nitride compound semiconductor layer 31 is etched such that the buffer layer 23 is exposed at the bottom portion of the trench. After carrying out the process illustrated by FIG. 3A, a fabricating method comprising an etching shallower than a thickness of a Group III nitride compound semiconductor layer 31, which is a bottom portion of the trench, and a fabricating method comprising an etching deeper than a thickness of a Group III nitride compound semiconductor layer 31, and a bottom portion of the trench is a Group III nitride compound semiconductor layer 22 or a buffer layer 21. In these methods, the Group III nitride compound semiconductor layer 32 formed above the bottom portion of the trench is mainly formed through lateral epitaxial growth from the post of the Group III nitride compound semiconductor layer 31 serving as a nucleus for epitaxial growth. As a result, a region whose propagation of threading dislocations in the vertical direction is suppressed (controlled) can be obtained. That shows the similar effect as described in FIG. 1.

By repeating the above described process more than two times, propagation of threading dislocations in the normal direction can be prevented multiple-folds (fifth through ninth features). As a result, propagation of threading dislocations can be prevented in extremely wider area (comparable with the surface of the substrate). That is shown in FIG. 4. By the first to fourth features, a first trench is formed, a first epitaxial growth is carried out, and the second Group III nitride compound semiconductor layer 32, having a region whose threading dislocations propagated from the first Group III nitride compound semiconductor layer 31 is prevented, is formed. Then at least one portion of the region whose threading dislocations propagated from the first Group III nitride compound semiconductor layer 31 is not prevented (the upper portion of the first post) is etched. In FIG. 4A, this etching is carried out so that a portion of the second Group III nitride compound semiconductor layer 32 remains at the upper portion of the first post. Alternatively, the etching may reach the first Group III nitride compound semiconductor layer 31. Accordingly, when a third Group III nitride compound semiconductor layer 33 is epitaxially grown in vertical and lateral directions from the top surface or the sidewall of the second trench of the second Group III nitride compound semiconductor layer 32 serving as a nucleus for epitaxial growth, the third Group III nitride compound semiconductor layer 33, which is formed on the upper portion of the region having suppressed threading dislocations in the second Group III nitride compound semiconductor layer 32, has also suppressed threading dislocations. And also because the third Group III nitride compound semiconductor layer 33, which is formed on the upper portion of the buried trench in the second Group III nitride compound semiconductor layer 32, is epitaxially grown from a sidewall of the trench serving as a nucleus for epitaxial growth, the layer 33 becomes a region having less threading dislocations.

Alternatively, the first trench/post may be a trench/post whose bottom portion is the different layer to the post as shown in FIG. 2, a trench/post which is formed on multiple layers as shown in FIG. 3, or a trench/post having other structures. In these cases, the second trench/post may be formed such that only the second Group III nitride compound semiconductor layer 32 is exposed or that until the upper layer of the first Group III nitride compound semiconductor layer 31 is etched. When the bottom portion of the trench is the different layer to the post as shown in FIG. 2, or a trench/post formed on multiple layers is regarded as the first trench as shown in FIG. 3, the second trench/post of upper layer may have a different structure to that of the first trench/post.

By forming an a light-emitting element on an upper layer of a lateral-epitaxially grown portion of a Group III nitride compound semiconductor layer produced through the above step, a light-emitting device endowed with improved service life time and an improved LD threshold value can be provided (tenth and eleventh features).

By selectively separating, from the other layers, an upper layer formed of a lateral epitaxial growth portion of the Group III nitride compound semiconductor layer obtained through the above step, there can be produced a high-crystallinity Group III nitride compound semiconductor in which crystal defects such as dislocations are remarkably suppressed (tenth and twelfth features). In this connection, for the sake of convenience in manufacture, the expression "removing substantially entire portions" does not exclude the case in which a portion containing threading dislocations is present to some extent.

BRIEF DESCRIPTION OF THE DRAWINGS

FIG. 10 is a schematic view showing the other example of etching of a first Group III nitride compound semiconductor; and FIG. 11 is a sectional view showing threading dislocations propagating in a Group III nitride compound semiconductor.

BEST MODE FOR CARRYING OUT THE INVENTION

Figure 1A:
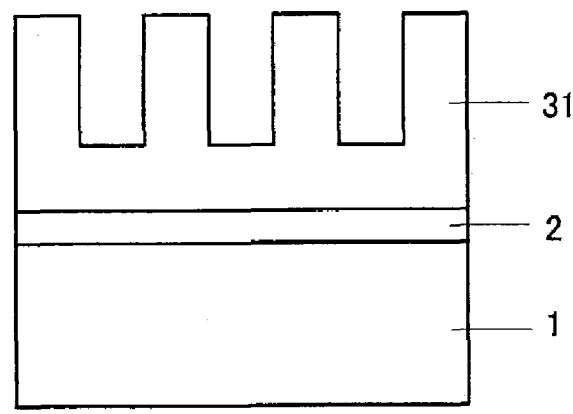
FIG. 1 is a series of sectional views showing the steps of fabricating a Group III nitride compound semiconductor according to a first embodiment of the present invention.
Figure 1B:
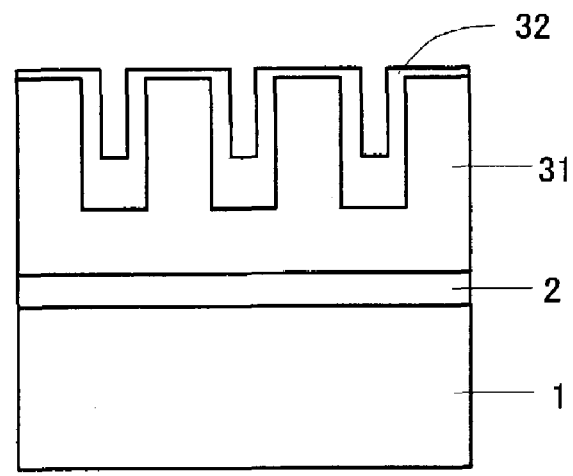
Figure 1C:
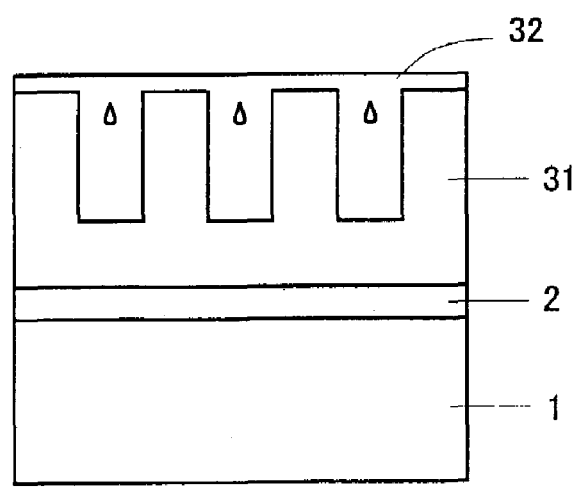

FIG. 1 schematically shows a mode for carrying out a method for fabricating a Group III nitride compound semiconductor of the present invention. A substrate 1, the buffer layer 2 if necessary, and a first Group III nitride compound semiconductor layer 31 are formed, followed by undergoing etching to form trenches/posts (FIG. 1A). As a result of etching, posts and trenches are formed; the unetched surface forms the tops of the posts; and sidewalls and bottom portions (bottom surfaces) of the trenches are formed. The sidewalls are, for example, {11-20} planes. Next, under conditions of lateral epitaxial growth, a second Group III nitride compound semiconductor 32 is epitaxially grown while the sidewalls of the trenches and the top surfaces of the posts serve as nuclei for epitaxial growth. A metal-organic growth process enables easy lateral epitaxial growth while the growth fronts remain the {11-20} planes. Portions of the second Group III nitride compound semiconductor 32 which are laterally grown from the sidewalls of the trenches are free from propagation of threading dislocation from the first Group III nitride compound semiconductor 31 (FIG. 1B). The form of etching and lateral epitaxial growth conditions are determined such that the fronts of lateral growth extending from the opposite sidewalls of the trenches coalesce above the bottoms of the trenches before the vertical growth from the bottom portion of the trench buries the etched portion, whereby threading dislocation is suppressed in the regions of the second Group III nitride compound semiconductor 32 formed above the bottoms of the trenches (FIG. 1C). By shifting the etching region and carrying out the equivalent process repeatedly, a third Group III nitride compound semiconductor 33 can be obtained having wider area in which threading dislocation is suppressed.

As an above-described mode for carrying out the invention allow selections to be described below.

When a laminate including a substrate and a Group III nitride compound semiconductor is to be formed, the substrate may be an inorganic crystalline substrate of sapphire, silicon (Si), silicon carbide (SiC), spinel ($MgAl_2O_4$), ZnO, MgO, or the like, and a Group III-V compound semiconductor, such as a gallium phosphide or gallium arsenide semiconductor, or a Group III nitride compound semiconductor, such as a gallium nitride (GaN) semiconductor, may be used.

A preferred process for forming a Group III nitride compound semiconductor layer is metal-organic chemical vapor deposition (MOCVD) or metal-organic vapor phase epitaxy (MOVPE). However, molecular beam epitaxy (MBE), halide vapor phase epitaxy (halide VPE), liquid phase epitaxy (LPE), or the like may be used. Also, individual layers may be formed by different growth processes.

When a Group III nitride compound semiconductor layer is to be formed on, for example, a sapphire substrate, in order to improve good crystallinity of the layer, a buffer layer is preferably formed for the purpose of correcting lattice mismatch with the sapphire substrate. When a substrate of another material is to be used, employment of a buffer layer is also preferred. A buffer layer is preferably of a Group III nitride compound semiconductor $Al_xGa_yIn_{1-x-y}N$ ($0 \leq x \leq 1$, $0 \leq y \leq 1$, $0 \leq x+y \leq 1$) formed at low temperature, more preferably of $Al_xGa_{1-x}N$ ($0 \leq x \leq 1$). This buffer layer may be a single layer or a multi-component layer comprising layers of different compositions. A buffer layer may be formed by MOCVD at a low temperature of 380–420° C. or at a temperature of 1000–1180° C. Alternatively, an AlN buffer layer can be formed by a reactive sputtering process using a DC magnetron sputtering apparatus and, as materials, high-purity aluminum and nitrogen gas. Similarly, a buffer layer represented by the formula $Al_xGa_yIn_{1-x-y}N$ ($0 \leq x \leq 1$, $0 \leq y \leq 1$, $0 \leq x+y \leq 1$, arbitrary composition) can be formed. Furthermore, vapor deposition, ion plating, laser abrasion, or ECR can be employed. When a buffer layer is to be formed by physical vapor deposition, physical vapor deposition is performed preferably at 200–600° C., more preferably 300–500° C., most preferably 400–500° C. When physical vapor deposition, such as sputtering, is employed, the thickness of a buffer layer is preferably 100–3000 angstroms, more preferably 100–400 angstroms, most preferably 100–300 angstroms. A multi-component layer may comprise, for example, alternating $Al_xGa_{1-x}$ N ($0 \leq x \leq 1$) layers and GaN layers. Alternatively, a multi-component layer may comprise alternating layers of the same composition formed at a temperature of not higher than 600° C. and at a temperature of not lower than 1000° C. Of course, these arrangements may be combined. Also, a multi-component layer may comprise three or more different types of Group III nitride compound semiconductors $Al_xGa_yIn_{1-x-y}N$ ($0 \leq x \leq 1$, $0 \leq y < 1$, $0 \leq x+y \leq 1$). Generally, a buffer layer is amorphous and monocrystalline is formed as an intermediate layer. Repetitions of unit of a buffer layer and an intermediate layer may be formed, and the number of repetitions is not particularly limited. The greater the number of repetitions, the greater the improvement in crystallinity.

The present invention is substantially applicable even when the composition of a buffer layer and that of a Group III nitride compound semiconductor formed on the buffer layer are such that a portion of Group III elements are replaced with boron (B) or thallium (Tl) or a portion of nitrogen (N) atoms are replaced with phosphorus (P), arsenic (As), antimony (Sb), or bismuth (Bi). Also, the buffer layer and the Group III nitride compound semiconductor may be doped with any one of these elements to such an extent as not to appear in the composition thereof. For example, a Group III nitride compound semiconductor which is represented by $Al_xGa_{1-x}N$ ($0 \leq x \leq 1$) and which does not contain indium (In) and arsenic (As) may be doped with indium (In), which is larger in atomic radius than aluminum (Al) and gallium (Ga), or arsenic (As), which is larger in atomic radius than nitrogen (N), to thereby improve crystallinity through compensation, by means of compression strain, for crystalline expansion strain induced by dropping off of nitrogen atoms. In this case, since acceptor impurities easily occupy the positions of Group III atoms, p-type crystals can be obtained as grown. Through the thus-attained improvement of crystallinity combined with the features of the present invention, threading dislocation can be further reduced to approximately 1/100 to 1/1000. In the case of an underlying layer comprising two or more repetitions of a buffer layer and a Group III nitride compound semiconductor layer, the Group III nitride compound semiconductor layers are further preferably doped with an element greater in atomic radius than a predominant component element. In the case where an emission layer and an active layer of a light-emitting device are target products, use of a binary or ternary Group III nitride compound semiconductor is preferred.

When an n-type Group III nitride compound semiconductor layer is to be formed, a Group IV or Group VI element, such as Si, Ge, Se, Te, or C, can be added as an n-type impurity. A Group II or Group IV element, such as Zn, Mg, Be, Ca, Sr, or Ba, can be added as a p-type impurity. The same layer may be doped with a plurality of n-type or p-type impurities or doped with both n-type and p-type impurities.

Preferably, the front of lateral epitaxial growth is perpendicular to a substrate. However, lateral epitaxial growth may progress while slant facets with respect to the substrate are maintained. In this case, trenches may have a V-shaped cross section with no flat surface on the bottom of the trench.

Preferably, lateral epitaxial growth progresses such that at least an upper portion of the front of lateral epitaxial growth is perpendicular to the surface of a substrate. More preferably, growth fronts are {11-20} planes of a Group III nitride compound semiconductor.

The depth and width of trenches to be etched is determined such that lateral epitaxial growth fills the trenches.

When the crystal orientation of a Group III nitride compound semiconductor layer to be formed on a substrate can be predicted, masking or etching in the form of stripes perpendicular to the a-plane ({11-20} plane) or the m-plane ({1-100} plane) of the Group III nitride compound semiconductor layer is favorable. The aforementioned stripe or mask patterns may be island-like or grid-like or may assume other forms. The front of lateral epitaxial growth may be perpendicular or oblique to the surface of a substrate. In order for the a-plane; i.e., the (11-20) plane, of a Group III nitride compound semiconductor layer to become the front of lateral epitaxial growth, the lateral direction of stripes must, for example, be perpendicular to the m-plane; i.e., the (1-100) plane, of the Group III nitride compound semiconductor layer. For example, when the surface of a substrate is the a-plane or the c-plane of sapphire, the m-plane of sapphire usually matches the a-plane of a Group III nitride compound semiconductor layer formed on the substrate. Thus, etching is performed according to the arrangement of the planes. In the case of a point-like, grid-like, or island-like etching, planes that define an outline (sidewalls) are preferably {11-20} planes.

An etching mask may comprise a polycrystalline semiconductor, such as polycrystalline silicon or polycrystalline nitride semiconductor; an oxide or nitride, such as silicon oxide (SiO$_x$), silicon nitride (SiN$_x$), titanium oxide (TiO$_x$), or zirconium oxide (ZrO$_x$); or a high-melting-point metal, such as titanium (Ti) or tungsten (W); or may assume the form of a multi-layer film thereof. The etching mask may be formed by a vapor phase growth process, such as vapor deposition, sputtering, or CVD, or other processes.

Reactive ion beam etching (RIE) is preferred for etching, but any other etching process may be employed. When trenches having sidewalls oblique to the surface of a substrate are to be formed, anisotropic etching is employed. By means of anisotropic etching, trenches are formed such that the trenches have a V-shaped cross section with no flat surface on the bottom of the trench.

A semiconductor device, such as an FET or a light-emitting device, can be formed on the above-described Group III nitride compound semiconductor having regions where threading dislocation is suppressed, throughout the entire region or mainly on the regions where threading dislocation is suppressed. In the case of a light-emitting device, a light-emitting layer assumes a multi-quantum well (MQW) structure, a single-quantum well (SQW) structure, a homo-structure, a single-hetero-structure, or a double-hetero-structure, or may be formed by means of, for example, a pin junction or a pn junction.

The above-described Group III nitride compound semiconductor having regions where threading dislocation is suppressed can be formed as a Group III nitride compound semiconductor substrate through removal of, for example, the substrate 1, the buffer layer 2, and portions of the Group III nitride compound semiconductor where threading dislocation is not suppressed. The thus-formed substrate allows formation of a Group III nitride compound semiconductor device thereon or may be used as a substrate for forming a greater Group III nitride compound semiconductor crystal. The removal can be performed by mechanochemical polishing or any other appropriate process.

The present invention will next be described with reference to specific embodiments. The embodiments will be described while mentioning a method for fabricating a light-emitting device. However, the present invention is not limited to the embodiments to be described below. The present invention discloses a method for fabricating a Group III nitride compound semiconductor applicable to fabrication of any device.

The Group III nitride compound semiconductor of the present invention was fabricated by metal-organic vapor phase epitaxy (hereinafter called "MOVPE"). Typical gases used include ammonia (NH$_3$), carrier gas (H$_2$ or N$_2$), trimethylgallium (Ga(CH$_3$)$_3$, hereinafter called "TMG"), trimethylaluminum (Al(CH$_3$)$_3$, hereinafter called "TMA"), trimethylindium (In(CH$_3$)$_3$, hereinafter called "TMI"), and cyclopentadienylmagnesium (Mg(C$_5$H$_5$)$_2$, hereinafter called "Cp$_2$Mg").

[First Embodiment]

FIG. 1 shows the steps of the present embodiment. A monocrystalline sapphire substrate 1 was prepared such that the a-plane thereof cleaned through organic cleaning and heat treatment serves as the main surface thereof. Temperature was dropped to 400° C., and H$_2$ (10 L/min), NH$_3$ (5 L/min), and TMA (20 μmol/min) were supplied for approximately 3 minutes to thereby form, on the sapphire substrate 1, a buffer layer 2 of AlN having a thickness of approximately 40 nm. Next, while the temperature of the sapphire substrate 1 was maintained at 1000° C., H$_2$ (20 L/min), NH$_3$ (10 L/min), and TMG (300 μmol/min) were introduced to thereby form a GaN layer 31 having a thickness of approximately 3 μm.

By use of a hard bake resist mask, stripe-shaped trenches each having a width of 1 μm and a depth of 2 μm were selectively dry-etched at intervals of 1 μm by reactive ion beam etching (RIE). As a result, posts of the GaN layer 31 each having a width of 1 μm and trenches each having a depth of 2 μm and a width of 1 μm at a bottom thereof were alternatingly formed (FIG. 1A). At this time, the {11-20} planes of the GaN layer 31 were caused to serve as the sidewalls of the trenches of a depth of 2 μm.

Next, while the temperature of the sapphire substrate 1 was maintained at 1150° C., H$_2$ (20 L/min), NH$_3$ (10 L/min), and TMG (5 μmol/min) were introduced to thereby form a GaN layer 32 through lateral epitaxial growth performed while the sidewalls of the trenches of a depth of 2 μm; i.e., the {11-20} planes of the GaN layer 31, serve as nuclei. At this time, epitaxial growth took place from the top surfaces of the posts and from the bottoms of the trenches (FIG. 1B). Lateral epitaxial growth was performed while the {11-20} planes primarily served as the growth fronts, thereby filling the trenches and thus establishing a flat top surface (FIG. 1C). Subsequently, H$_2$ (20 L/min), NH$_3$ (10 L/min), and TMG (300 μmol/min) were introduced to thereby grow the GaN layer 32 such that the total thickness of the GaN layer 31 and the GaN layer 32 becomes 4 μm. In contrast to portions of the GaN layer 32 formed above the top surfaces of the posts, portions of the GaN layer 32 formed above the bottoms of the trenches extending as deep as 2 μm through the GaN layer 31 exhibited significant suppression of threading dislocation.

[Second Embodiment]

The present embodiment is illustrated in FIG. 2. A monocrystalline sapphire substrate 1 was prepared such that the a-plane thereof cleaned through organic cleaning and heat treatment serves as the main surface thereof. Temperature was dropped to 400° C., and H$_2$ (10 L/min), NH$_3$ (5 L/min), and TMA (20 μmol/min) were supplied for approximately 3 minutes to thereby form, on the sapphire substrate 1, an AlN layer 2 having a thickness of approximately 40 nm. Next, while the temperature of the sapphire substrate 1 was maintained at 1000° C., H$_2$ (20 L/min), NH$_3$ (10 L/min), and TMG (300 μmol/min) were introduced to thereby form a GaN layer 31 having a thickness of approximately 2 μm.

Figure 2A:
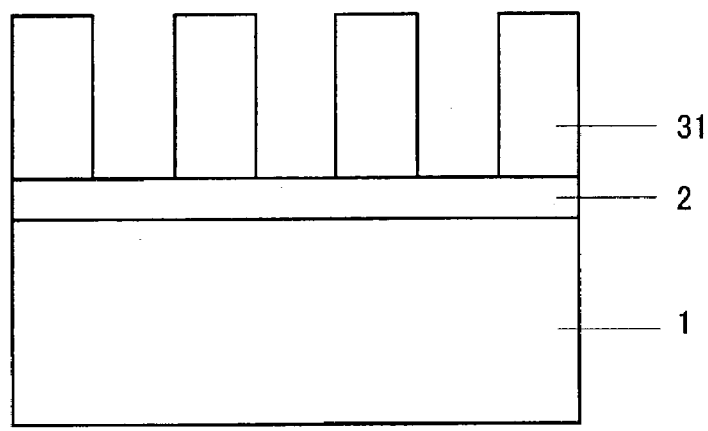
FIG. 2 is a series of sectional views showing the steps of fabricating a Group III nitride compound semiconductor according to a second embodiment of the present invention.

Next, by use of a hard bake resist mask, stripe-shaped trenches each having a width of 1 μm and a depth of 2 μm were selectively dry-etched at intervals of 1 μm by reactive ion beam etching (RIE). As a result, posts of the GaN layer 31 each having a width of 1 μm and a depth of 2 μm and trenches each having a width of 1 μm and having the buffer layer 2 exposed at the bottom thereof were alternatingly formed (FIG. 2A). At this time, the {11-20} planes of the GaN layer 31 were caused to serve as the sidewalls of the trenches of a depth of 2 μm.

Figure 2B:
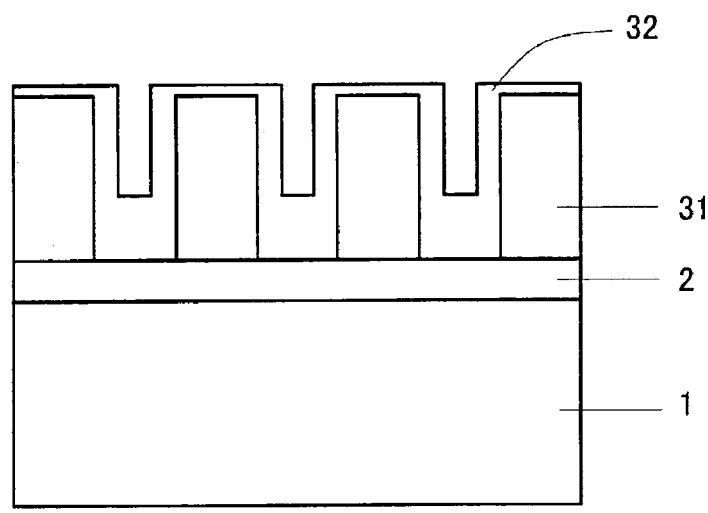
Figure 2C:
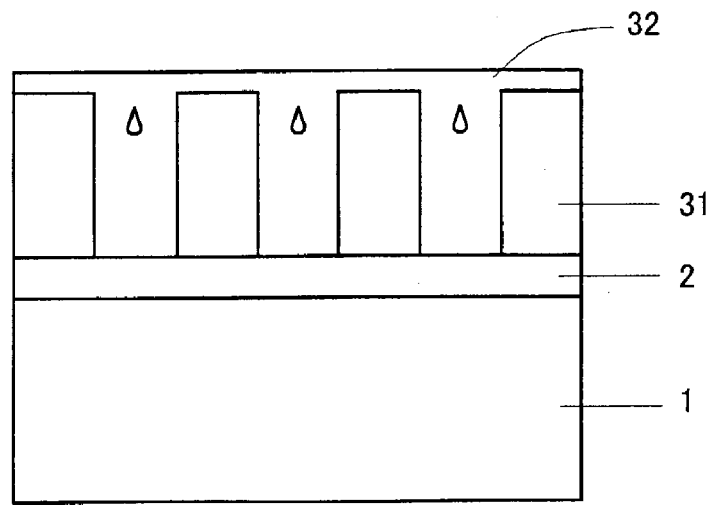

Next, while the temperature of the sapphire substrate 1 was maintained at 1150° C., H$_2$ (20 L/min), NH$_3$ (10 L/min), and TMG (2 μmol/min) were introduced to thereby form a GaN layer 32 through lateral epitaxial growth performed while the sidewalls of the trenches of a depth of 2 μm; i.e., the {11-20} planes of the GaN layer 31, serve as nuclei. At this time, epitaxial growth took place from the top surfaces of the posts and from the surface of the buffer layer 2 exposed at the bottoms of the trenches (FIG. 2B). Lateral epitaxial growth was performed while the {11-20} planes primarily served as the growth fronts, thereby filling the trenches and thus establishing a flat top surface (FIG. 2C). Subsequently, H$_2$ (20 L/min), NH$_3$ (10 L/min), and TMG (300 μmol/min) were introduced to thereby grow the GaN layer 32 such that the total thickness of the GaN layer 31 and the GaN layer 32 becomes 3 μm. In contrast to portions of the GaN layer 32 formed above the top surfaces of the posts, portions of the GaN layer 32 formed above the bottoms of the trenches extending as deep as 2 μm through the GaN layer 31 exhibited significant suppression of threading dislocation.

[Third Embodiment]

Figure 3A:
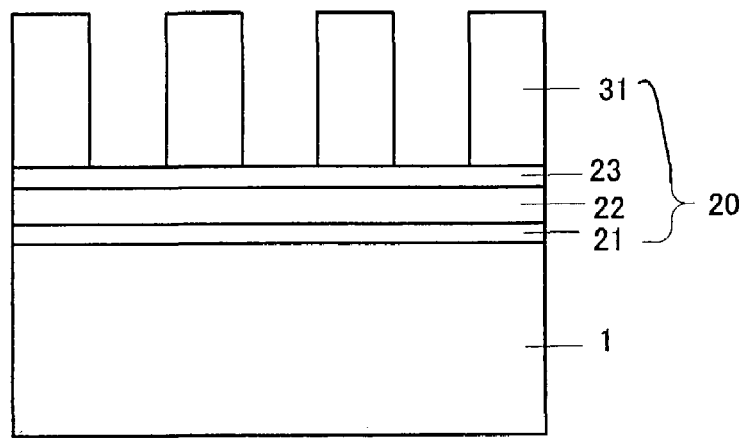
FIG. 3 is a series of sectional views showing the steps of fabricating a Group III nitride compound semiconductor according to a third embodiment of the present invention.
Figure 3B:
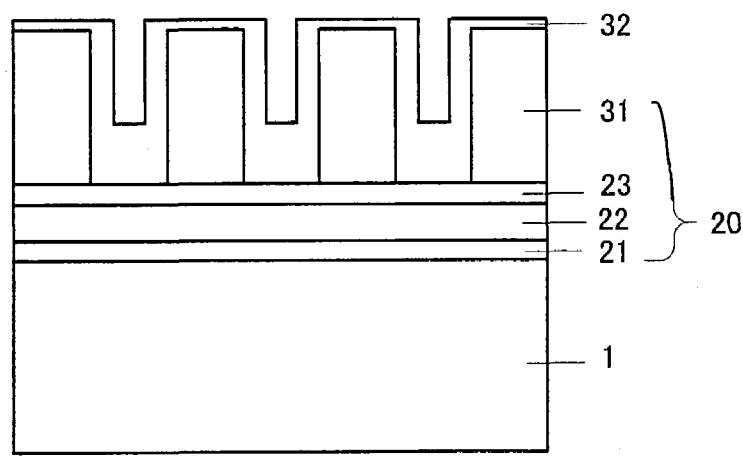
Figure 3C:
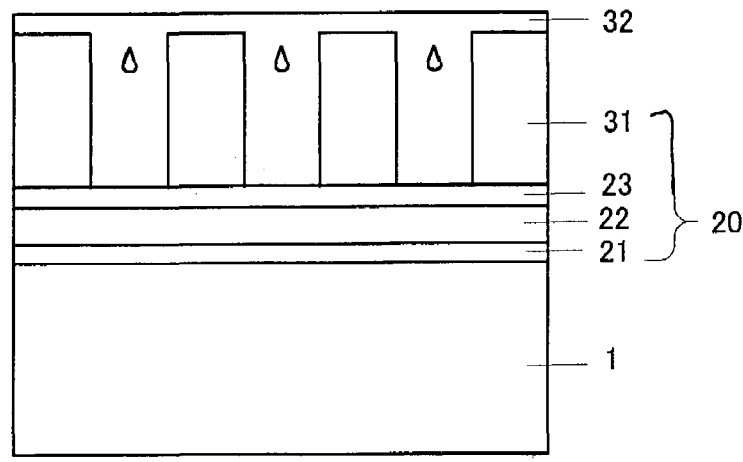

The present embodiment used an underlying layer comprising a plurality of layers as shown in FIG. 3. A monocrystalline sapphire substrate 1 was prepared such that the a-plane thereof cleaned through organic cleaning and heat treatment serves as the main surface thereof. Temperature was dropped to 400° C., and $H_2$ (10 L/min), $NH_3$ (5 L/min), and TMA (20 μmol/min) were supplied for approximately 3 minutes to thereby form, on the sapphire substrate 1, a first AlN layer (first buffer layer) 21 having a thickness of approximately 40 nm. Next, while the temperature of the sapphire substrate 1 was maintained at 1000° C., $H_2$ (20 L/min), $NH_3$ (10 L/min), and TMG (300 μmol/min) were introduced to thereby form a GaN layer (intermediate layer) 22 having a thickness of approximately 0.3 μm. Next, the temperature was dropped to 400° C., and $H_2$ (10 L/min), $NH_3$ (5 L/min), and TMA (20 μmol/min) were supplied for approximately 3 minutes to thereby form a second AlN layer (second buffer layer) 23 having a thickness of approximately 40 nm. Next, while the temperature of the sapphire substrate 1 was maintained at 1000° C., $H_2$ (20 L/min), $NH_3$ (10 L/min), and TMG (300 μmol/min) were introduced to thereby form a GaN layer 31 having a thickness of approximately 2 μm. Thus was formed an underlying layer comprising the first AlN layer (first buffer layer) 21 having a thickness of approximately 40 nm, the GaN layer (intermediate layer) 22 having a thickness of approximately 0.3 μm, the second AlN layer (second buffer layer) 23 having a thickness of approximately 40 nm, and the GaN layer 31 having a thickness of approximately 2 μm.

Next, by use of a hard bake resist mask, stripe-shaped trenches each having a width of 1 μm and a depth of 2 μm were selectively dry-etched at intervals of 1 μm by reactive ion beam etching (RIE). As a result, posts of the GaN layer 31 each having a width of 1 μm and a height of 2 μm and trenches each having a width of 1 μm and having the second AlN layer 23 exposed at the bottom thereof were alternatingly formed (FIG. 3). At this time, the {11-20} planes of the GaN layer 31 were caused to serve as the sidewalls of the trenches of a depth of 2 μm.

Next, while the temperature of the sapphire substrate 1 was maintained at 1150° C., $H_2$ (20 L/min), $NH_3$ (10 L/min), and TMG (5 μmol/min) were introduced to thereby form a GaN layer 32 through lateral epitaxial growth performed while the sidewalls of the trenches of a depth of 2 μm; i.e., the {11-20} planes of the GaN layer 31, serve as nuclei. At this time, epitaxial growth took place from the top surfaces of the posts and from the surface of the second AlN layer 23 (a different layer) exposed at the bottoms of the trenches. Lateral epitaxial growth was performed while the {11-20} planes primarily served as the growth fronts, thereby filling the trenches and thus establishing a flat top surface. Subsequently, $H_2$ (20 L/min), $NH_3$ (10 L/min), and TMG (300 μmol/min) were introduced to thereby grow the GaN layer 32 such that the total thickness of the GaN layer 31 and the GaN layer 32 becomes 3 μm. In contrast to portions of the GaN layer 32 formed above the top surfaces of the posts, portions of the GaN layer 32 formed above the bottoms of the trenches extending as deep as 2 μm through the GaN layer 31 exhibited significant suppression of threading dislocation.

[Fourth Embodiment]

Figure 4A:
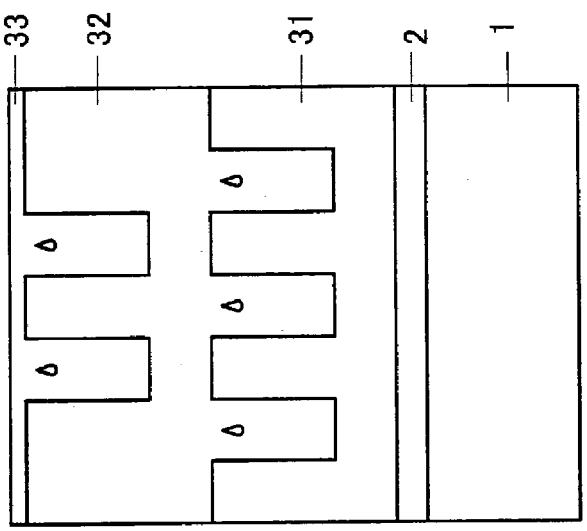
FIG. 4 is a series of sectional views showing the steps of fabricating a Group III nitride compound semiconductor according to a fourth embodiment of the present invention.

As in the first embodiment, a buffer layer 2 and a GaN layer 31 were formed in 3 μm of thickness on a sapphire substrate 1. Then trenchs having {11-20} planes serving as a sidewall were formed. Lateral epitaxial growth was performed while the {11-20} planes primarily served as the growth fronts, thereby filling the trenches, and a GaN layer 32 was grown thereon. The GaN layer 31 has a thickness of 3 μm and the total thickness of the GaN layer 31 and the GaN layer 32 were designed to become 6 μm. The part of the GaN layer 32 formed above the posts of GaN layer 31 at the etching thereof was etched in a depth of 2 μm so that the {11-20} planes might be served as the sidewalls of the trenches (FIG. 4A). Here, a portion of the GaN layer 32, which was formed on the upper portion of the top layer of the posts of the GaN layer 31 at etching, was not etched. At this time, the {11-20} planes of the GaN layer 32 were caused to serve as the sidewalls of the trenches of a depth of 2 μm.

Figure 4B:
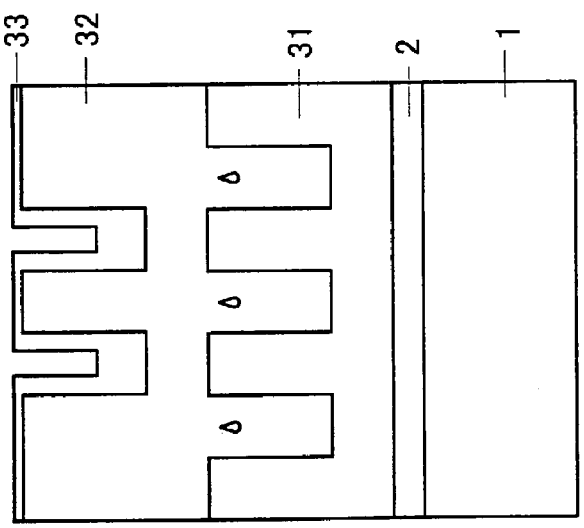
Figure 4C:
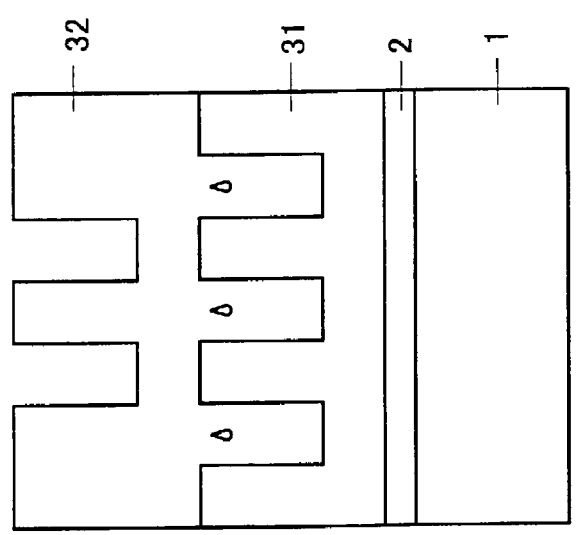

Next, while the temperature of the sapphire substrate 1 was maintained at 1150° C., $H_2$ (20 L/min), $NH_3$ (10 L/min), and TMG (5 μmol/min) were introduced to thereby form a GaN layer 33 through lateral epitaxial growth performed while the sidewalls of the trenches of a depth of 2 μm; i.e., the {11-20} planes of the GaN layer 32, serve as nuclei. At this time, epitaxial growth took place from the top surfaces of the posts and from the bottoms of the trenches (FIG. 4B). Lateral epitaxial growth was performed while the {11-20} planes primarily served as the growth fronts, thereby filling the trenches and thus establishing a flat top surface (FIG. 4C). Subsequently, $H_2$ (20 L/min), $NH_3$ (10 L/min), and TMG (300 μmol/min) were introduced to thereby grow the GaN layer 33 such that the total thickness of the GaN layer 31, the GaN layer 32, and the GaN layer 33 becomes 7 μm. In contrast to portions of the GaN layer 33 formed above the common top surfaces of the posts of the GaN layers 31 and 32, portions of the GaN layer 33 formed above the bottoms of the trenches extending as deep as 2 μm through the GaN layers 31 and 32 exhibited significant suppression of threading dislocation, which is extremely wider range compared with that of the GaN layer 32 in the first embodiment.

[Fifth Embodiment]

Figure 5:
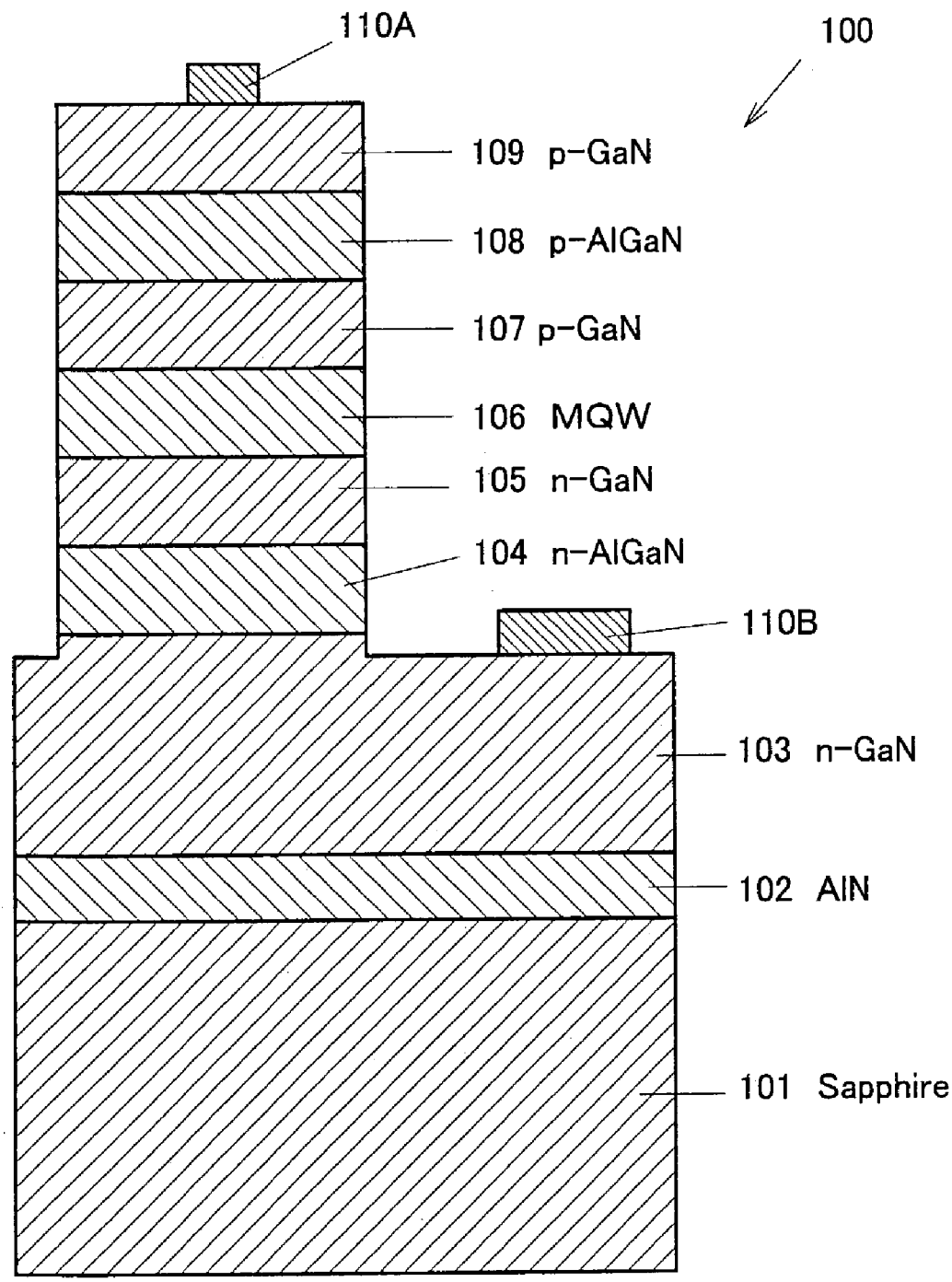
FIG. 5 is a sectional view showing the structure of a Group III nitride compound semiconductor light-emitting device according to a fifth embodiment of the present invention.

On a wafer formed in a manner similar to that of the fourth embodiment, a laser diode (LD) 100 shown in FIG. 5 was formed in the following manner. Notably, in formation of the GaN layer 33, silane ($SiH_4$) was introduced so as to form a silicon (Si)-doped n-type GaN layer serving as the GaN layer 33. For the sake of simplified illustration, the drawing merely illustrates a GaN layer 103 to inclusively represent the GaN layer 31, the GaN layer 32, and the GaN layer 33.

On a wafer comprising a sapphire substrate 101, a buffer layer 102 of AlN, and the three-layered GaN layer 103 consisting of two GaN layers and an n-type GaN layer, an n-clad layer 104 of silicon (Si)-doped $Al_{0.08}Ga_{0.92}N$, an n-guide layer 105 of silicon (Si)-doped GaN, an MQW-structured light-emitting layer 106, a p-guide layer 107 of magnesium (Mg)-doped GaN, a p-clad layer 108 of magnesium (Mg)-doped $Al_{0.08}Ga_{0.92}N$, and a p-contact layer 109 of magnesium (Mg)-doped GaN were formed. Next, an electrode 110A of gold (Au) was formed on the p-contact layer 109. Etching was partially performed until the three-layered GaN layer 103 consisting of two GaN layers and the n-type GaN layer was exposed. On the exposed GaN layer 103, an electrode 110B of aluminum (Al) was formed. The thus-formed laser diode (LD) 100 exhibited the significant improvement of device life time and light-emitting efficiency.

[Sixth Embodiment]

Figure 6:
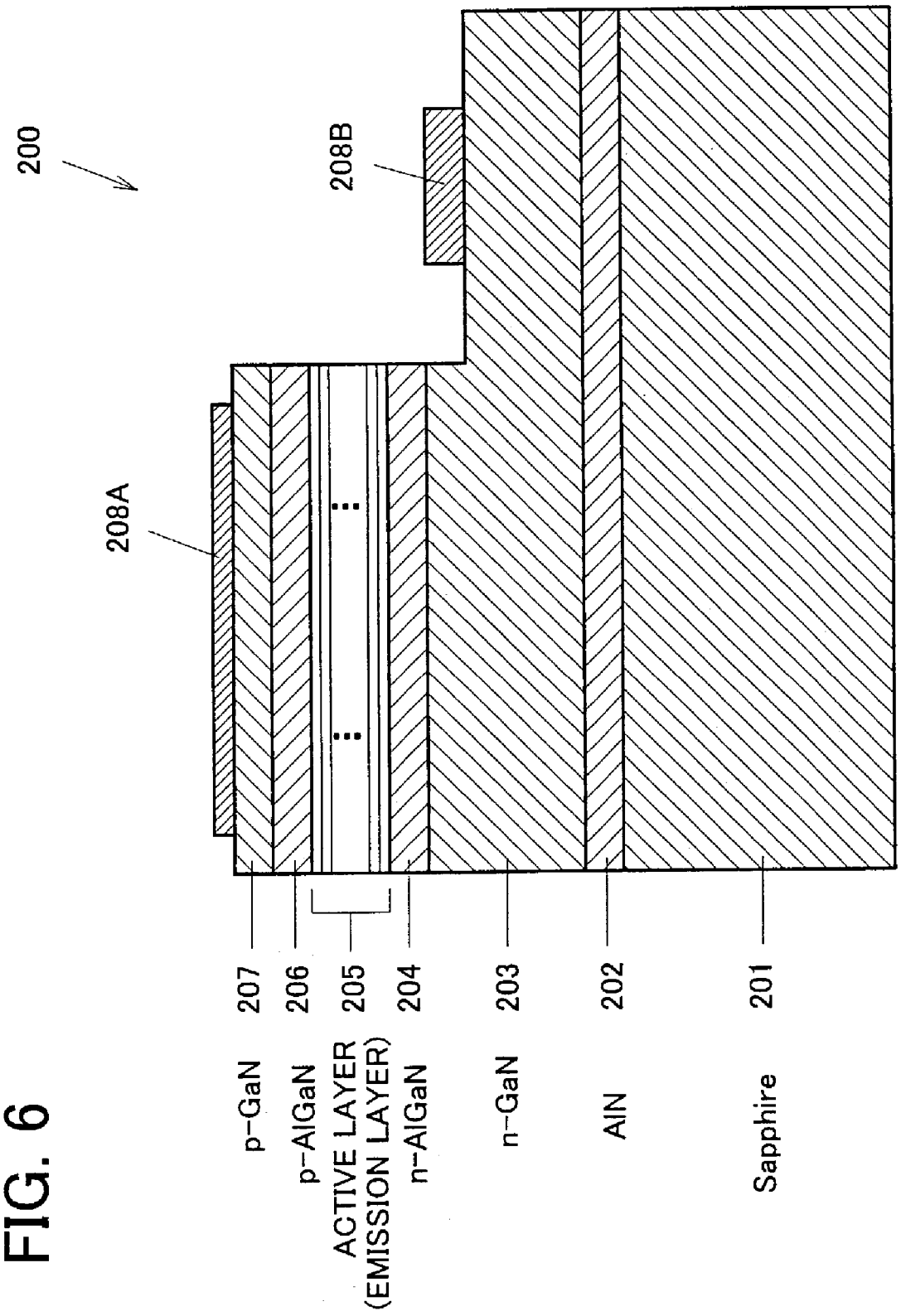
FIG. 6 is a sectional view showing the structure of a Group III nitride compound semiconductor light-emitting device according to a sixth embodiment of the present invention.

On a wafer formed in a manner similar to that of the first embodiment, a light-emitting diode (LED) 200 shown in FIG. 6 was formed in the following manner. Notably, in formation of the GaN layer 32, silane (SiH$_4$) was introduced so as to form a silicon (Si)-doped n-type GaN layer serving as the GaN layer 32. For the sake of simplified illustration, the drawing merely illustrates a GaN layer 203 to inclusively represent the GaN layer 31 and the GaN layer 32.

On a wafer comprising a sapphire substrate 201, a buffer layer 202 of AlN, and the two-layered GaN layer 203 consisting of a GaN layer and an n-type GaN layer, an n-clad layer 204 of silicon (Si)-doped Al$_{0.08}$Ga$_{0.92}$N, a light-emitting layer 205, a p-clad layer 206 of magnesium (Mg)-doped Al$_{0.08}$Ga$_{0.92}$N, and a p-contact layer 207 of magnesium (Mg)-doped GaN were formed. Next, an electrode 208A of gold (Au) was formed on the p-contact layer 207. Etching was partially performed until the two-layered GaN layer 203 consisting of the GaN layer and the n-type GaN layer was exposed. On the exposed GaN layer 203, an electrode 208B of aluminum (Al) was formed. The thus-formed light-emitting diode (LED) exhibited the significant improvement of device life time and light-emitting efficiency.

[Seventh Embodiment]

The present embodiment used an n-type silicon (Si) substrate. On the n-type silicon (Si) substrate 301, a silicon (Si)-doped Al$_{0.15}$Ga$_{0.85}$N layer 3021 having a thickness of 3 μm was formed at a temperature of 1150° C. through supply of H$_2$ (10 L/min), NH$_3$ (10 L/min), TMG (100 μmol/min), TMA (10 μmol/min), and silane (SiH$_4$) diluted with H$_2$ gas to 0.86 ppm (0.2 μmol/min). Next, by use of a hard bake resist mask, stripe-shaped trenches each having a width of 1 μm and a depth of 2 μm were selectively dry-etched at intervals of 1 μm by reactive ion beam etching (RIE). As a result, posts each having a width of 1 μm and trenches each having a depth of 2 μm and a width of 1 μm exposed at the bottom thereof were alternatingly formed as the n-Al$_{0.15}$Ga$_{0.85}$N layer 3021. At this time, the {11-20} planes of the n-Al$_{0.15}$Ga$_{0.85}$N layer 3021 were caused to serve as the sidewalls of the trenches of a depth of 2 μm.

Next, while the temperature of the n-type silicon substrate 301 was maintained at 1150° C., H$_2$ (20 L/min), NH$_3$ (10 L/min), TMG (5 μmol/min), TMA (0.5 μmol/min), and silane (SiH$_4$) diluted with H$_2$ gas (0.01 nmol/min) were introduced to thereby form an n-Al$_{0.15}$Ga$_{0.85}$N layer 3022 through lateral epitaxial growth performed while the sidewalls of the trenches of a depth of 2 μm; i.e., the {11-20} planes of the n-Al$_{0.15}$Ga$_{0.85}$N layer 3021, serve as nuclei. At this time, epitaxial growth took place from the top surfaces of the posts and from the bottoms of the trenches. Lateral epitaxial growth was performed while the {11-20} planes primarily served as the growth fronts, thereby filling the trenches and thus establishing a flat top surface. Subsequently, H$_2$ (10 L/min), NH$_3$ (10 L/min), TMG (100 μmol/min), TMA (10 μmol/min), and silane (SiH$_4$) diluted with H$_2$ gas (0.2 μmol/min) were introduced to thereby grow the n-Al$_{0.15}$Ga$_{0.85}$N layer 3022 such that the total thickness of the n-Al$_{0.15}$Ga$_{0.85}$N layer 3021 and the n-Al$_{0.15}$Ga$_{0.85}$N layer 3022 becomes 4 μm. Hereinafter, the n-Al$_{0.15}$Ga$_{0.85}$N layer 3021 and the n-Al$_{0.15}$Ga$_{0.85}$N layer 3022 having a total thickness of 4 μm are inclusively represented by an n-Al$_{0.15}$Ga$_{0.85}$N layer 302.

Figure 7:
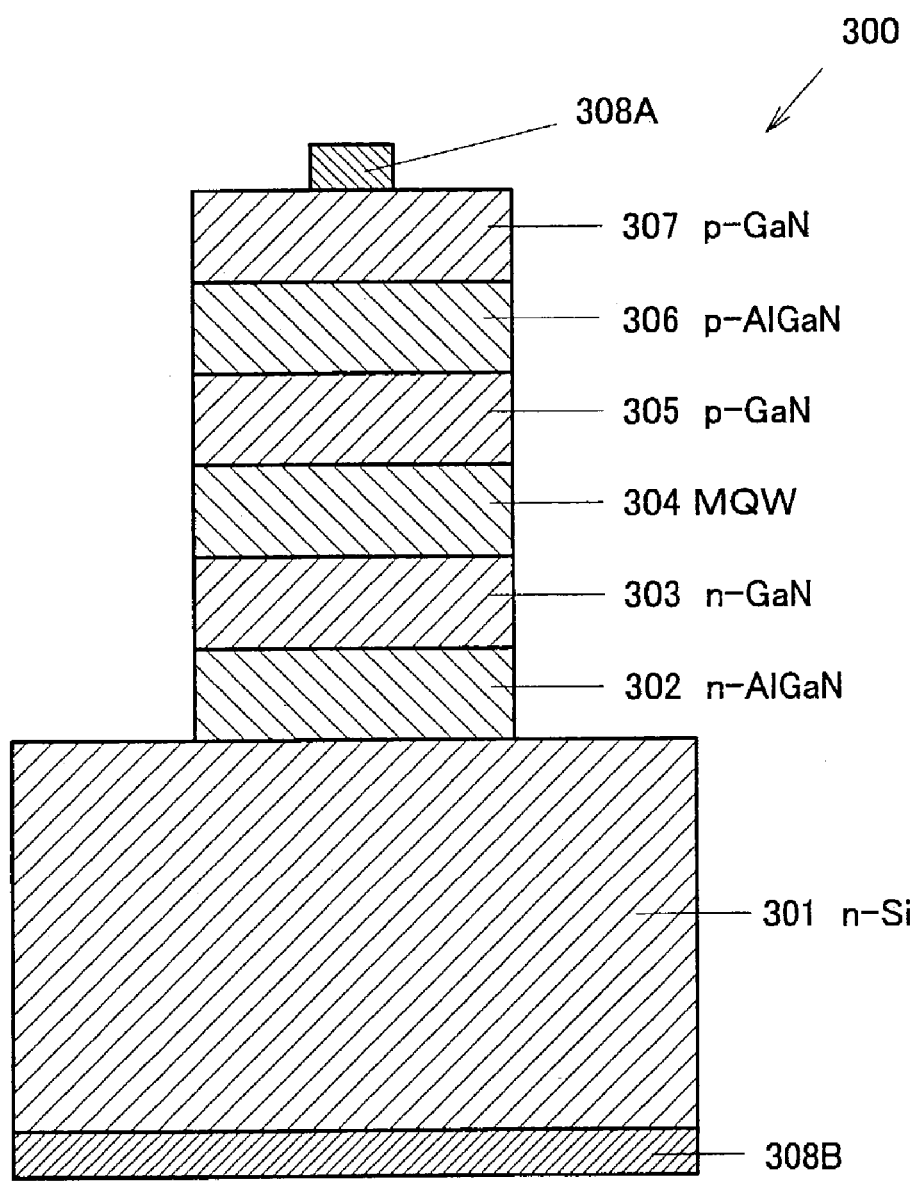
FIG. 7 is a sectional view showing the structure of a Group III nitride compound semiconductor light-emitting device according to a seventh embodiment of the present invention.

On the n-Al$_{0.15}$Ga$_{0.85}$N layer 302 formed on the n-type silicon substrate 301, an n-guide layer 303 of silicon (Si)-doped GaN, an MQW-structured light-emitting layer 304, a p-guide layer 305 of magnesium (Mg)-doped GaN, a p-clad layer 306 of magnesium (Mg)-doped Al$_{0.08}$Ga$_{0.92}$N, and a p-contact layer 307 of magnesium (Mg)-doped GaN were formed. Next, an electrode 308A of gold (Au) was formed on the p-contact layer 307, and an electrode 308B of aluminum (Al) was formed on the back side of the silicon substrate 301 (FIG. 7). The thus-formed laser diode (LD) 300 exhibited the significant improvement of device life time and light-emitting efficiency.

[Eighth Embodiment]

Figure 8:
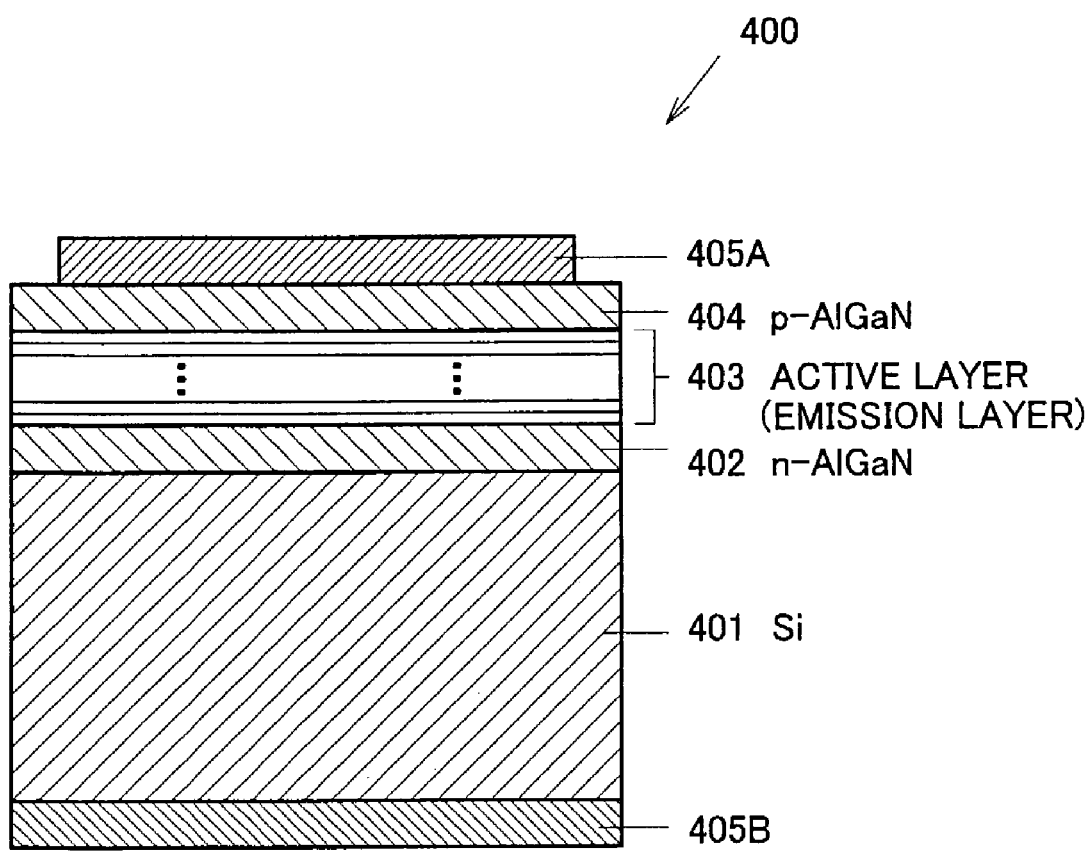
FIG. 8 is a sectional view showing the structure of the Group III nitride compound semiconductor light-emitting device according to the eighth embodiment of the present invention.

The present embodiment used an n-type silicon (Si) substrate. As in the seventh embodiment which used a wafer comprising the n-type silicon substrate 301 and the n-Al$_{0.15}$Ga$_{0.85}$N layer 302 formed thereon, the present embodiment prepared a wafer comprising an n-type silicon substrate 401 and an n-Al$_{0.15}$Ga$_{0.85}$N layer 402 formed on the substrate 401. On the wafer, a light-emitting layer 403 and a p-clad layer 404 of magnesium (Mg)-doped Al$_{0.15}$Ga$_{0.85}$N were formed. Next, an electrode 405A of gold (Au) was formed on the p-clad layer 404, and an electrode 405B of aluminum (Al) was formed on the back side of the silicon substrate 401 (FIG. 8). The thus-formed light-emitting diode (LED) 400 exhibited the significant improvement of device life time and light-emitting efficiency.

[Modification of Etching]

The present invention is not limited to what etched surface is. Various modifications are described hereinafter.

Figure 9A:
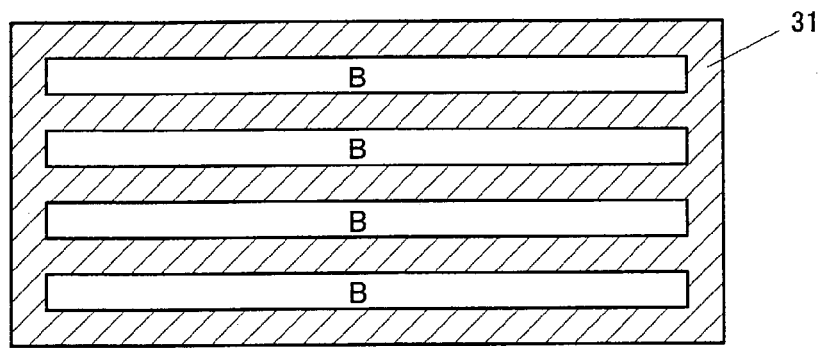
FIG. 9 is a schematic view showing another example of etching of a first Group III nitride compound semiconductor.
Figure 9B:
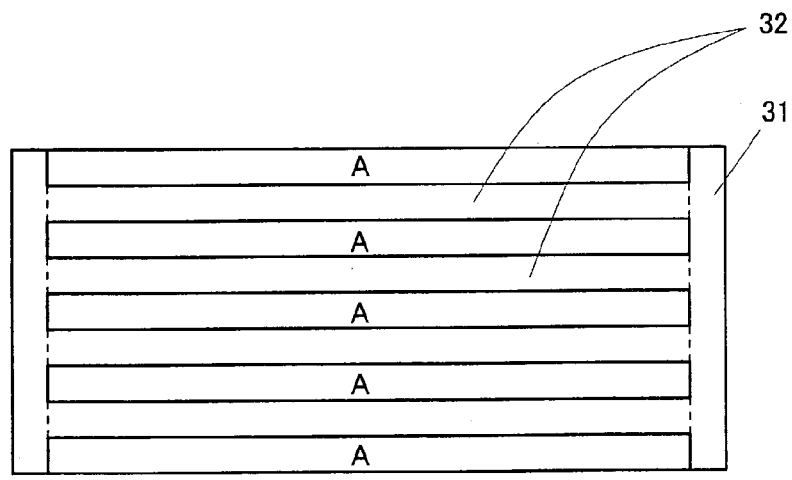
Figure 9C:
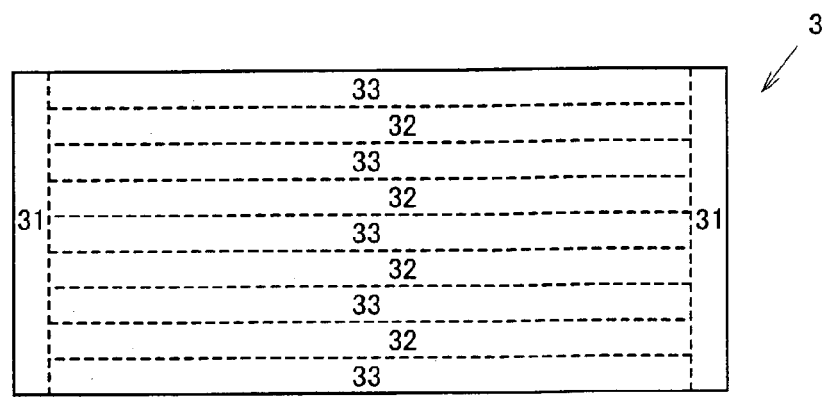

FIG. 9 schematically shows locations of etching in the first GaN layer 31 and the second GaN layer 32 in the fourth embodiment. As shown in FIG. 9A, etching is performed in the form of stripes so as to form posts of the GaN layer 31 (hatched in FIG. 9) and trenches denoted by letter B. As shown in FIG. 9B, etching is performed in the form of stripes so as to form trenches denoted by letter A and posts of the GaN layer 32 which fill the trenches denoted by letter B in FIG. 9A. Thus a GaN layer 33 is formed through lateral epitaxial growth. As a result, as shown in FIG. 9C, there are formed regions denoted by reference numeral 31 where threading dislocation is propagated from the GaN layer 31, regions denoted by reference numeral 32 which are upper portions of the GaN layer 32 formed through lateral epitaxial growth and where threading dislocation is suppressed, and regions denoted by reference numeral 33 which are upper portions of the GaN layer 33 formed through lateral epitaxial growth and where threading dislocation is suppressed.

FIG. 10 shows an example in which island-like posts are formed by means of three groups of {11-20} planes. To facilitate understanding, the schematic view of FIG. 10A includes a peripheral region formed by means of three groups of {11-20} planes. In actuality, tens of millions of island-like posts may be formed per wafer. In FIG. 10A, the area of the bottoms of the trenches B is 3 times the area of the top surfaces of the island-like posts. In FIG. 10B, the area of the bottoms of the trenches B is 8 times the area of the top surfaces of the island-like posts.

While the present invention has been described with reference to the above embodiments, the present invention is not limited thereto, but may be modified as appropriate without departing from the spirit of the invention.

What is claimed is:

1. A method for fabricating a Group III nitride compound semiconductor through epitaxial growth comprising:

etching an underlying layer which comprises at least one layer of a Group III nitride compound semiconductor and a first Group III nitride compound semiconductor as an uppermost layer, to thereby form a trench/post having an island structure; and epitaxially growing, vertically and laterally, a second Group III nitride compound semiconductor, with a top surface of the post and a sidewall/sidewalls of the trench serving as a nucleus for epitaxial growth, wherein a depth and a width of said trench are determined such that lateral growth from said sidewall/sidewalls for covering said trench proceeds faster than vertical growth from the bottom portion of said trench for burying said trench, and said trench comprises a cavity formed in said second Group III nitride compound semiconductor.

2. A method for fabricating a Group III nitride compound semiconductor according to claim 1, wherein substantially all of said sidewalls of said trench comprise a {11-20} plane.

3. A method for fabricating a Group III nitride compound semiconductor according to claim 1, wherein said first Group III nitride compound semiconductor and said second Group III nitride compound semiconductor comprise the same composition.

4. A method for fabricating a Group III nitride compound semiconductor through epitaxial growth comprising:
  etching an underlying layer which comprises at least one layer of a Group III nitride compound semiconductor and a first Group III nitride compound semiconductor as uppermost layer, to thereby form an island structure, so as to provide a first trench/post;
  epitaxially growing, vertically and laterally, a second Group III nitride compound semiconductor, with a top surface of said post and a sidewall of said first trench serving as a nucleus for epitaxial growth,
  etching at least a portion of said second Group III nitride compound semiconductor corresponding to the upper region of the post of said first trench/post, so as to provide a second trench/post, said second Group III nitride compound semiconductor being grown from said top surface and a sidewall of said first post of said first Group III nitride compound semiconductor served as a nucleus;
  epitaxially growing, at least one of vertically and laterally, a third Group III nitride compound semiconductor, with a top surface of said post and a sidewall of said second trench as a nucleus for epitaxial growth; and
  removing substantially entire portions of said second Group III nitride compound semiconductor except for an upper layer formed on a portion provided through lateral epitaxial growth, to thereby obtain a Group III nitride compound semiconductor substrate.

5. A method for fabricating a Group III nitride compound semiconductor according to claim 4, wherein a depth and a width of said first and second trenches are determined such that lateral growth from said sidewall/sidewalls for covering said trench proceeds faster than vertical growth from the bottom portion of said trench for burying.

6. A method for fabricating a Group III nitride compound semiconductor according to claim 4, wherein substantially all of said sidewalls of said trench comprise a {11-20} plane.

7. A method for fabricating a Group III nitride compound semiconductor according to claim 5, wherein substantially all of said sidewalls of said trench comprise a {11-20} plane.

8. A method for fabricating a Group III nitride compound semiconductor according to claim 4, wherein said first Group III nitride compound semiconductor and said second Group III nitride compound semiconductor comprise the same composition.

9. A method for fabricating a Group III nitride compound semiconductor according to claim 5, wherein said first Group III nitride compound semiconductor and said second Group III nitride compound semiconductor comprise the same composition.

10. A method for fabricating a Group III nitride compound semiconductor according to claim 4, wherein said second Group III nitride compound semiconductor and said third Group III nitride compound semiconductor comprise the same composition.

11. A method for fabricating a Group III nitride compound semiconductor according to claim 5, wherein said second Group III nitride compound semiconductor and said third Group III nitride compound semiconductor comprise the same composition.

12. A method for fabricating a Group III nitride compound semiconductor according to claim 8, wherein said second Group III nitride compound semiconductor and said third Group III nitride compound semiconductor comprise the same composition.

13. A method for fabricating a Group III nitride compound semiconductor according to claim 1, further comprising:
  removing substantially entire portions of said second Group III nitride compound semiconductor except for an upper layer formed on a portion provided through lateral epitaxial growth, to thereby obtain a Group III nitride compound semiconductor substrate.

14. A method for fabricating a Group III nitride compound semiconductor according to claim 2, further comprising:
  removing substantially entire portions of said second Group III nitride compound semiconductor except for an upper layer formed on a portion provided through lateral epitaxial growth, to thereby obtain a Group III nitride compound semiconductor substrate.

15. A method for fabricating a Group III nitride compound semiconductor according to claim 3, further comprising:
  removing substantially entire portions of said second Group III nitride compound semiconductor except for an upper layer formed on a portion provided through lateral epitaxial growth, to thereby obtain a Group III nitride compound semiconductor substrate.

16. A method for fabricating a Group III nitride compound semiconductor through epitaxial growth comprising:
  etching an underlying layer which comprises at least one layer of a Group III nitride compound semiconductor and a first Group III nitride compound semiconductor as uppermost layer, to thereby form an island structure, so as to provide a first trench/post;
  epitaxially growing, vertically and laterally, a second Group III nitride compound semiconductor, with a top surface of said post and a sidewall of said first trench serving as a nucleus for epitaxial growth,
  etching at least a portion of said second Group III nitride compound semiconductor corresponding to the upper region of the post of said first trench/post, so as to provide a second trench/post, said second Group III nitride compound semiconductor being grown from said top surface and a sidewall of said first post of said first Group III nitride compound semiconductor served as a nucleus;
  epitaxially growing, at least one of vertically and laterally, a third Group III nitride compound semiconductor, with a top surface of said post and a sidewall of said second trench as a nucleus for epitaxial growth; and
  removing substantially entire portions except for an upper layer formed on a portion of said second and third Group III nitride compound semiconductors provided through lateral epitaxial growth, to thereby obtain a Group III nitride compound semiconductor substrate.

17. A method for fabricating a Group III nitride compound semiconductor according to claim 1, wherein said island structure comprises at least one of a dot structure, a striped structure, and a grid structure.

18. A method for fabricating a Group III nitride compound semiconductor according to claim 4, wherein said island structure comprises at least one of a dot structure, a striped structure, and a grid structure.

* * * * *